United States Patent
Liaw et al.

[19]

[11] Patent Number: 5,874,359
[45] Date of Patent: Feb. 23, 1999

[54] SMALL CONTACTS FOR ULTRA LARGE SCALE INTEGRATION SEMICONDUCTOR DEVICES WITHOUT SEPARATION GROUND RULE

[75] Inventors: Ing-Ruey Liaw; Jau-Hwang Ho; Meng-Jaw Cherng, all of Hsinchu, Taiwan

[73] Assignee: Industrial Technology Research Institute, Hsin-Chu, Taiwan

[21] Appl. No.: 873,828

[22] Filed: Jun. 12, 1997

Related U.S. Application Data

[63] Continuation of Ser. No. 429,709, Apr. 27, 1995, abandoned.
[51] Int. Cl.$^6$ .................................................. H01L 21/44
[52] U.S. Cl. ........................... 438/640; 438/639; 438/673; 438/666
[58] Field of Search .................... 438/668, 637, 438/640, 647, 657, 639, 673, 666

[56] References Cited

U.S. PATENT DOCUMENTS

| | | | |
|---|---|---|---|
| 5,084,416 | 1/1992 | Ozaki et al. . | |
| 5,279,989 | 1/1994 | Kim | 437/195 |
| 5,279,990 | 1/1994 | Sun et al. | 437/195 |
| 5,288,655 | 2/1994 | Higasitani et al. | 437/52 |
| 5,294,296 | 3/1994 | Yoon et al. | 156/657.1 |
| 5,350,706 | 9/1994 | McElroy et al. | 437/52 |
| 5,358,903 | 10/1994 | Kim | 437/195 |
| 5,368,682 | 11/1994 | Park | 156/644.1 |
| 5,464,787 | 11/1995 | Ryou . | |
| 5,719,089 | 2/1998 | Cherng et al. | 438/637 |

*Primary Examiner*—Caridad Everhart
*Attorney, Agent, or Firm*—George O. Saile; Stephen B. Ackerman

[57] ABSTRACT

A method for fabricating very narrow contacts on semiconductor substrate for increasing the packing density of devices on Ultra Large Scale Integration (ULSI) circuits was achieved. The method involves using conventional photolithographic techniques and anisotropic plasma etching to etch openings in a conducting layer and partially etch into an underlying planar insulating layer that covers and isolates the devices and device contact areas. Another conformal conducting layer is deposited on the substrate and in the openings and then etched back to form sidewall spacers in the openings. Using the original conducting layer and the sidewall spacers as an etch mask, the planar insulating layer is anisotropically etched within the sidewall spacers to form very narrow (small) contact opening to the desired device contact areas. Still another conducting layer is then deposited to fill the very narrow contact openings making electrical contact to the device contact areas, and then the conducting layers are patterned to form the next level of connecting metallurgy.

12 Claims, 6 Drawing Sheets

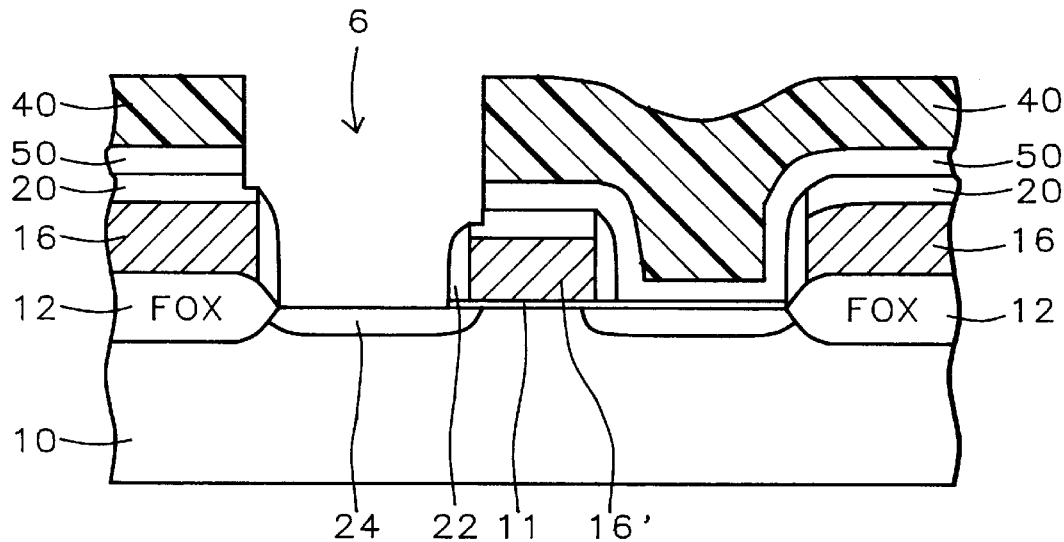
FIG. 1 – Prior Art
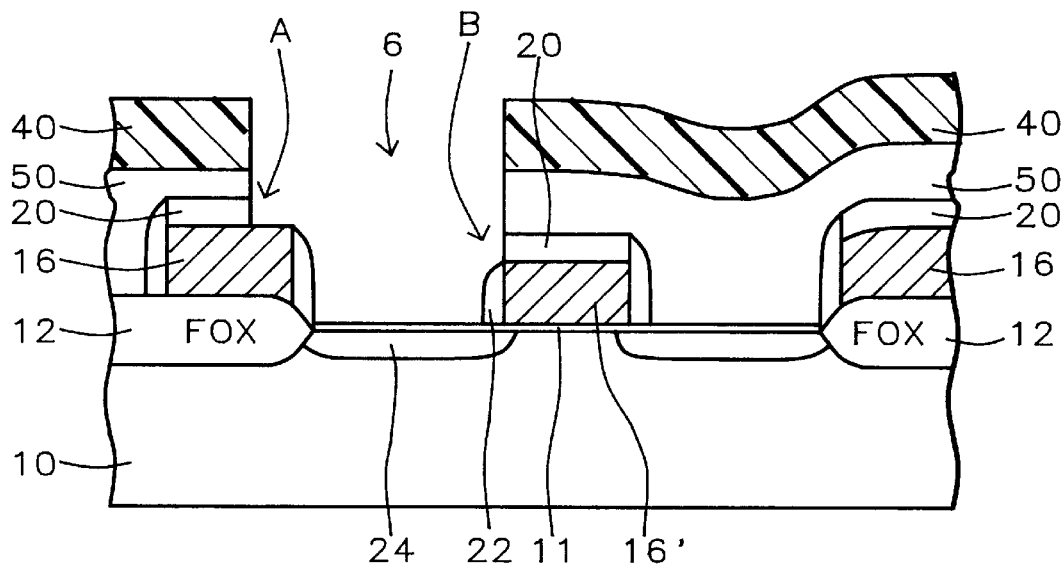
FIG. 2

SMALL CONTACTS FOR ULTRA LARGE SCALE INTEGRATION SEMICONDUCTOR DEVICES WITHOUT SEPARATION GROUND RULE

This a continuation of U.S. patent application Ser. No. 08/429,709, filed Apr. 27, 1995, now abandoned.

BACKGROUND OF THE INVENTION (1) Field of the Invention

This invention relates to semiconductor integrated circuit devices, and is directed to a method of forming small (sub half-micrometer) contacts to devices on semiconductor substrates for Ultra Large Scale Integration (ULSI) circuits. More specifically, the method achieves higher packing density of storage cells on dynamic random access memory (DRAM) chips.

(2) Description of the Prior Art

In recent years, the integrated circuit density on the semiconductor substrate have dramatically increased. This increase in density has resulted from down scaling of the individual devices built in and on the substrate and the interconnecting patterned electrical conducting layers that are used to wire up the devices. Future requirements for even greater increases in packing density is putting additional demand on the semiconductor technologies, such as improved resolution in the photolithography and plasma etching techniques.

One processing area limiting the packing density is the fabrication of reliable small contacts to the semiconductor substrate between the closely spaced discrete devices. And more particularly, it is important to make good electrical contact to the source/drain areas of the field effect transistors (FETS) on integrated circuits chips such as the dynamic random access memory (DRAM), static random access memory (SRAM) and the like. One method of making reliable contacts to the substrate having closely spaced interconnecting wiring is described by J. K. Kim, U.S. Pat. No. 5,358,903, however, the method does not address the concern of making contacts adjacent to devices, such as are required for source/drain areas of FETs.

It is common practice in the semiconductor industry to use self-aligned contacts to the source/drain areas of FETs to achieve tighter design ground rules, and thereby achieving a high packing density on the chip. For example, referring now to FIG. 1, a schematic cross sectional view of a partially completed FET is shown having a patterned photoresist mask 40 for etching a conventional self-aligned contact opening 6 to one of the two source/drain areas 8 of an FET, such as on DRAM chips. FIG. 1 shows a portion of the silicon substrate 10 having an active device area surrounded by a field oxide (FOX) areas 12. A patterned polysilicon layer 16 is used to form word lines 16 on the DRAM circuit with the portion over the active device area serving as the gate electrode 16' of the FET. An insulating layers 20 and insulating side wall spacers 22, composed of, for example, silicon oxide, are formed, respectively, over and on the side of the gate electrode 16' and also on the word lines 16. After forming doped source/drain regions 24, for example, by ion implantation, an insulating layer 26, such as silicon oxide, is deposited on the substrate to insulate the source/drain contacts 24. A patterned photoresist mask 40 and etching is then used to etch the self-aligned contact openings 6, as shown in FIG. 1. When the overlapping contact opening 6 is etched in the insulating layer 26 and the thin gate oxide 11 to the source/drain area 24, the insulating layer 20 and the side wall spacers 22 protect the gate electrode from shorting to the source/drain 24 when an electrical contact (not shown in FIG. 1) is made to the source/drain areas 24 .

Unfortunately, as the device packing density on future integrated circuits continues to increase, such as on the array of storage cells of future 64 megabit, 256 megabit and higher megabit DRAM chips, the lateral dimensions of the spacing between word lines and gate electrodes must further decrease. This leads to a problem in forming the self aligned contacts, as is depicted for a high density chip in FIG. 2. For example, referring now to FIG. 2, when the spacing are reduced to about 0.4 micrometers or less between the word lines 16 and also between gate electrodes 16' over device areas, the insulating layer 26 conformally coats, and thereby fills the spaces between the lines. This forms a planar or almost planar surface on the insulating layer 26. If a conventional self-aligning contact opening 6, is etched using the photoresist mask 40 and anisotropic etching, then the insulating layer 20 and sidewall spacers 22 are unintentionally removed over portions of the gate electrode 16' and word line 16. This occurs since the insulating layer 26 is substantially thinner over the word line than over the source/drain areas 24. This results in electrical shorts between the source/drain area 24 and gate electrode 16' at the points A and B, as depicted in FIG. 2. when the electrical contacts (not shown) are made to the source/drain areas 24.

Therefore, there is still a strong need in the semiconductor industry for forming very small electrical contacts for ULSI circuits that have closely spaced patterned conducting layers in order to avoid the shorting problem. There is also a strong need in the semiconductor industry for making these small contacts using conventional optical photolithographic techniques so as to avoid the added cost required in using more advanced shorter wavelength lithographies, such as X-ray and electron beams.

SUMMARY OF THE INVENTION

Accordingly, it is a principal object of this invention to provide electrical contact structures having very small contact openings and a method for making such structures.

It is another object of the present invention to provide a method for forming the small contact openings using conventional optical photolithographic techniques.

It is still another object of the invention to fabricate these very narrow contact structures on semiconductor substrates using a cost effective manufacturing process.

Now in accordance with this invention, a method is described for forming very small contacts on semiconductor substrates for ULSI circuits, and more particularly for contacts to the source/drain areas of field effect transistors (FETs). And the invention is especially applicable for the formation of electrical contacts to the node contact areas and the bit line contact areas on dynamic random access memory (DRAM) chips. The method of this invention is now described for the utilization of these very narrow contacts for the storage capacitor node contacts on DRAM chips.

The method begins by providing a semiconductor substrate, such as a P-doped single crystal silicon substrate having device areas surrounded and isolated from each other by a Field OXide (FOX). A first conducting layer, composed of a polycrystalline silicon (polysilicon) having an N-type dopant, is deposited on the substrate and then patterned by conventional photolithographic techniques and plasma etching to form the FET gate electrodes on the device areas and form the interconnecting conducting lines over field oxide areas, such as the word lines on DRAM chips. An insulating layer having a low flow temperature, such as a borophosphosilicate glass (BPSG), is deposited over the patterned first conducting layer and then planarized thereon by annealed at an elevated temperature. A second conducting layer, composed of an N-doped polysilicon, is deposited over the planar insulating layer. Opening are anisotropically etched in the second conducting layer and partially into the insulating layer, using photolithographic techniques and plasma etching. The openings are aligned over the selected device areas to which contact opening are to be made, such as the source/drain areas of the FET. A third conducting layer, for example, composed also of a doped polysilicon, is conformally deposited over the second conducting layer and in the openings. The third conducting layer is then blanket etched back to the second conducting layer forming sidewall spacers in the openings and exposing the surface of the insulating layer within the sidewall region. The insulating layer exposed within the sidewall spacer is then etched to the source/drain areas, thereby forming the very narrow contact opening. An anisotropic and selective etch is used to etch the insulating layer to the silicon substrate surface to form the contact opening, During the etching the second conducting layer and sidewall spacers function as the etch mask. A fourth conducting layer, for example composed of doped polysilicon or a polysilicon and metal silicide, is deposited on the second conducting layer and in the contact openings, thereby forming an electrical contact. The fourth and second conducting layers are then patterned by conventional photolithographic techniques and plasma etching to form the next level of the electrically conducting layer, such as the interconnect metallurgy for FETs. Alternatively, if the contact opening is a capacitor node contact of a DRAM cell then the electrically conducting layer, composed of polysilicon, can be patterned to form the bottom electrode of the capacitor. If the contact is made to the bit line contact of the FETs, then the electrically conducting layer can be patterned to form the bit lines.

BRIEF DESCRIPTION OF THE DRAWINGS

The objects and advantages of this invention are best understood by the following embodiment and with reference to the attached drawings which are now briefly described.

FIG. 1 is a schematic cross sectional view of a partially completed DRAM storage cell having a conventional self-aligned contact opening to the source/drain area for the node contact of the storage capacitor.

FIG. 2 is a schematic cross sectional view of a partially completed more advanced DRAM storage cell having very closely spaced word lines and FET gate electrodes and depicts the problem of forming the conventional self-aligned contact.

DESCRIPTION OF THE PREFERRED EMBODIMENTS

Now in keeping with the objects of this invention, the detailed method is described for forming the very narrow contacts (the word "small" is also used interchangeably to mean narrow.) for the storage capacitor node contacts on a dynamic random access memory (DRAM) cells. However, it should also be well understood by one skilled in art that the method of this invention can be equally applied, in general, for making electrical contacts to other areas on the semiconductor substrate, such as the bit line contact areas on DRAM cells and source/drain areas of FETs in general. The method is also equally applicable for making metal contacts, for example, between the multilevel wiring on semiconductor integrated circuits.

To more clearly understand the invention as it applies to applications on the DRAM chip, the parts of the DRAM structure numerically labeled in FIG. 2, depicting the nature of the problem, are also used in the FIGS. 3 through 12 to identify similar parts in the embodiment of this invention.

Figure 3:
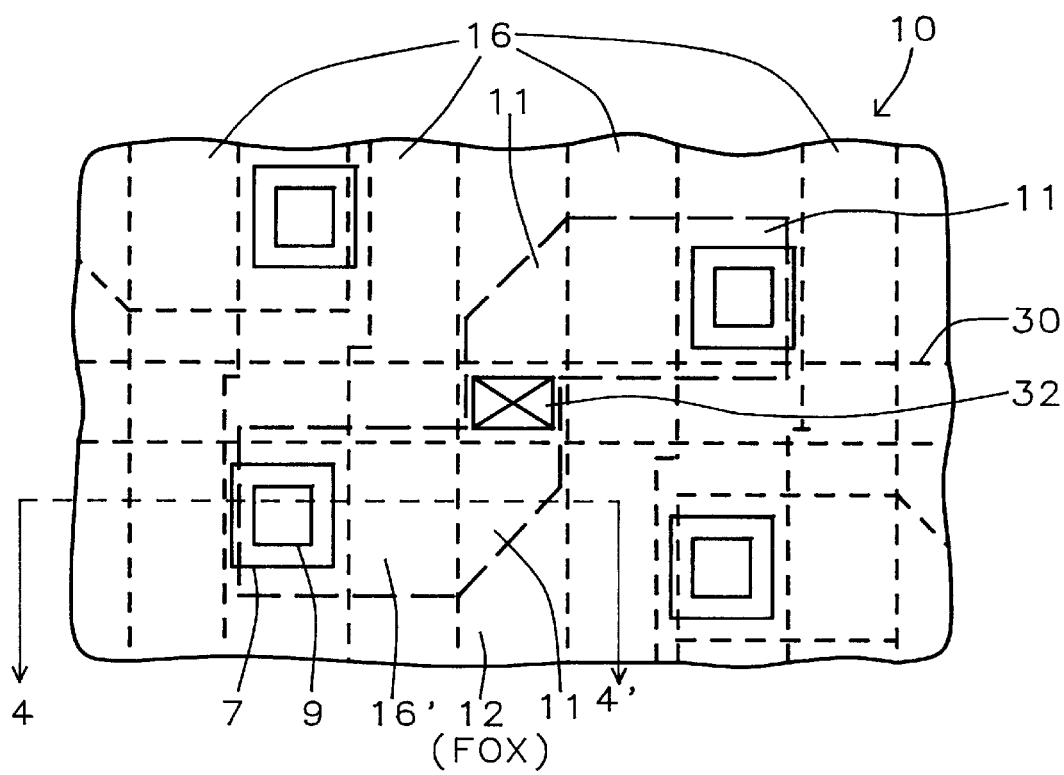
FIG. 3 is a schematic elevational view of a portion of the array of storage cells on a more advanced DRAM chip having closely spaced word lines and bit lines. The view depicts the very narrow contact opening of this invention.

Referring now to FIG. 3, a schematic elevational view of a partially completed DRAM device is shown for a portion of the storage cell area. Shown is the field oxide (FOX) area 12 surrounding and isolating one of the device areas 11. A first conducting layer 16, composed of a doped polysilicon, is patterned to form the FET gate electrodes, one electrode of which is shown labeled 16' and is over the device area 11. The portions of the patterned layer over field oxide areas 12 form the interconnecting word lines 16. After the word lines are formed and electrically insulated, for example, by depositing a silicon oxide layer, bit lines are formed, essentially orthogonal to the word lines 16. One of the many bit lines labeled 30 in FIG. 3 is shown making contact to one of the two source/drain contacts 32, of the FET having gate electrode 16'. The second of the two source/drain contacts is then used as the capacitor node contact 7 for the storage capacitor. The details of the embodiment of this invention are now described with reference to the cross section 4-4' through the capacitor node contact 7 and the gate electrode 16' as indicated in FIG. 3. As will become clear later in this embodiment the contact opening for the node contact 7, defined by the photoresist image, is further reduced in width (size), by the method of this invention, as indicate by the opening labeled 9 in FIG. 3.

The process for forming the very narrow contacts of this invention are now described with reference to FIG. 4, in which a cross sectional view of the partially completed DRAM structure is shown through the region 4-4' in FIG. 3. A brief description of the FET device structure is given so as to better understand the method of the invention, which is then described in detail.

The fabrication beings by providing a substrate 10. For example, the substrate 10 is preferably composed of a P-type single crystal silicon having a <100> crystallographic orientation. A relatively thick Field OXide (FOX) 12 is formed around the active device regions to isolate the individual device regions. Briefly, the field oxide as shown in FIG. 4, is formed by depositing a thin silicon oxide (pad oxide) and a thicker silicon nitride layer (not shown in the Fig.) are deposited on the silicon substrate 10 as a barrier to oxidation. Conventional photolithographic techniques and etching are then used to pattern the silicon nitride layer, removing the silicon nitride in areas where a field oxide is desired while retaining the silicon nitride in areas where active device are to be fabricated. The silicon substrate is then oxidized to form the Field OXide (FOX) 12, commonly referred to as LOCal oxidation of Silicon (LOCOS). The field oxide is preferably between about 4000 to 5000 Angstroms in thickness. The silicon nitride barrier layer and pad oxide in removed using a wet etch. For example, a hot phosphoric acid is used to removing the silicon nitride and a dilute hydrofluoric to remove the pad oxide. A good quality thin gate oxide 11, for the FET, is then formed on the active device area by thermal oxidation. The preferred thickness being from between about 100 to 140 Angstroms. A first conducting layer 16, composed of a doped polysilicon, is blanket deposited, for example, by low pressure chemical deposition (LPCVD) methods. The preferred thickness is between about 1000 to 2500 Angstroms. The polysilicon layer 16 is then doped by ion implantation using phosphorus ($P^{31}$) or arsenic ($As^{75}$) ions or alternatively, by in situ doping of the polysilicon during the low pressure chemical vapor deposition. The preferred dopant concentration being between about 1 E 20 to 1 E 22 atoms/cm$^3$. A first insulating layer 20 is then deposited on layer 16 and conventional photolithographic techniques and etching are used to pattern the insulating layer 20 and polysilicon layer 16. This forms the gate electrode 16' for the FET in the active device regions and the electrically conducting polysilicon lines 16 (word lines) on the field oxide areas 12. The word lines serve as the electrical wiring for connecting the FET gate electrodes to the appropriate peripheral circuits on the DRAM chip. Lightly doped source/drain areas 24 are formed next, usually by implanting an N-type dopant species such as arsenic or phosphorus. For example, a typical implant might consist of phosphorus $P^{31}$ at a dose of between about 1 E 12 to 1 E 14 atoms/cm$^2$ and more specifically an implant dose of 1.0 E 13 ions/cm$^2$. The typical ion implant energy is between about 30 to 80 Kev.

After forming lightly doped source/drain areas adjacent to the gate electrode 16', sidewall spacers 22 are formed on the gate electrode sidewalls, also shown in FIG. 3. These sidewall spacers 22 are formed by depositing a second insulating layer 22, and then anisotropically etching back the oxide layer to the silicon surface. For example, the insulating layer 22 can be composed of silicon oxide formed by low pressure chemical vapor deposition (LPCVD) using a reactant gas containing tetraethoxysilane (TEOS) and at a temperature in the range of between about 650° to 900° C. The etch back can be performed in a plasma etcher at low pressure, such as by reactive ion etching (RIE). The source/drain ohmic contacts are then formed by using a second ion implantation, alternatively, for this particular application of the invention the source/drain ohmic contacts can be achieved at a later processing step by out diffusion from a doped polysilicon layers.

Relating now more specifically to the method of this invention, a method is described in detail for forming very narrow electrical contacts to the source/drain areas of the FET having the closely spaced gate electrodes and word lines. For example, advanced DRAM devices having in excess of 64 Mbit of memory require spacing between word line of 0.4 micrometers or less and FET channel lengths less than 0.5 micrometers. However, to maintain an acceptable RC time constant, it is not desirable to proportionally down scale the vertical dimensions of the device, such as the gate electrode thickness or the insulating (dielectric) layers. Therefore, electrical shorting problems can arise, as described earlier in the section "Background of Invention" with reference to FIG. 2.

Referring now more specifically to FIGS. 5 through 12, the method for fabricating the very narrow electrical contact to the source/drain area between closely spaced gate electrodes and word lines is described.

Figure 4:
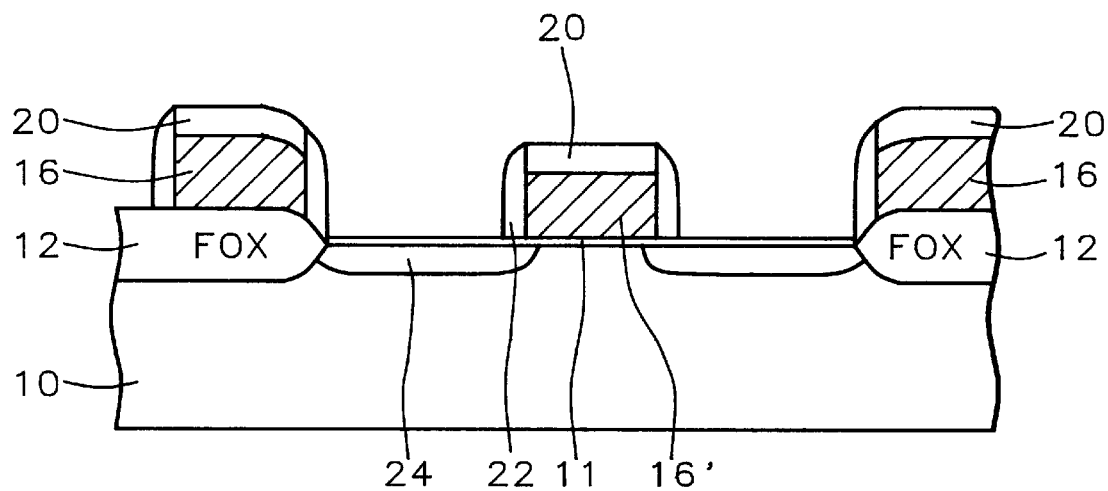
FIGS. 4 through 12 are schematic cross-sectional views of a partially completed DRAM storage cell showing the sequence of processing steps for forming the very narrow contact opening to the node contact of a DRAM storage cell.
Figure 5:
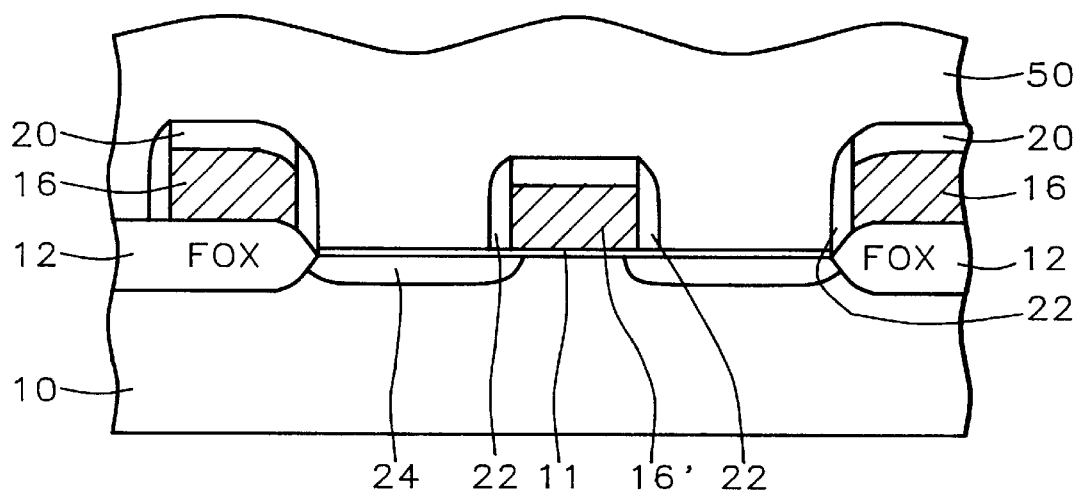

Referring next to FIG. 5, a planarizing insulating layer 50, comprising of a low melting temperature glass having a low flow temperature is deposited on the partially completed DRAM structure shown in FIG. 4. The preferred glass is a borophosphosilicate glass (BPSG), and the preferred thickness of layer 50 is between about 2000 to 4500 Angstroms. The layer 50 is then planarized by annealing in a furnace at a temperature of between about 800° to 900° C. for about 15 to 30 minutes.

Figure 6:
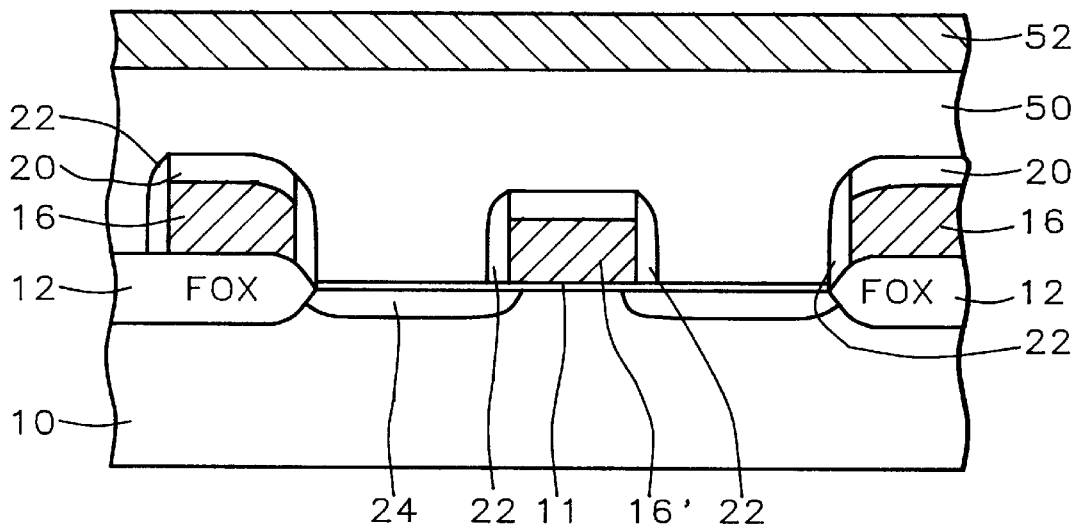

Referring now to FIG. 6, a second conducting layer 52 is deposited on the planar insulating layer 50. For the example in this embodiment, which is a node contact for the storage capacitor, layer 52 is preferably composed of a N-type doped polysilicon layer. The method of choice for depositing layer 52 is in a low pressure chemical vapor deposition reactor using, for example, a silane ($SiH_4$) gas. The preferred thickness of layer 52 is between about 2000 to 4500 Angstroms and the preferred dopant concentration is between about 1.0 E 20 to 1.0 E 22 atoms /cm$^3$. For example, the dopant species can be either arsenic (As) or phosphorous (P) and the doping can be achieved by either ion implantation or alternatively, by doping in situ during the polysilicon LPCVD by adding phosphine ($PH_3$) to the reactant gas.

Figure 7:
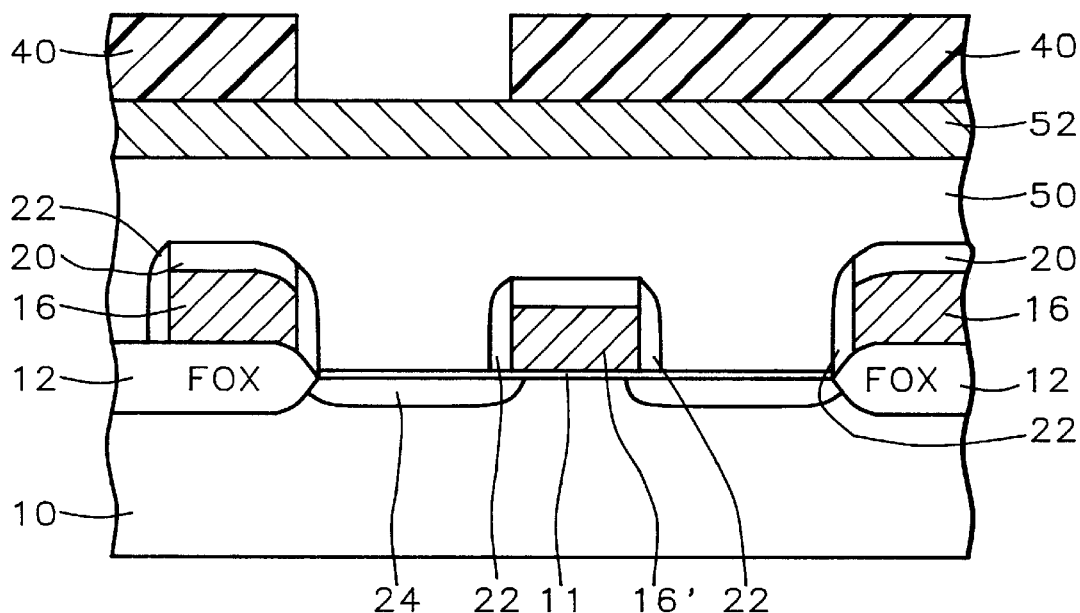

Now as shown in FIG. 7, a photoresist layer 40 is deposited on the second conducting layer 52, for example by using a spin coater. Conventional photolithographic techniques are then used to pattern the photoresist layer 40 forming opening aligned over the node contact source/drain area 24, as shown in FIG. 7.

Figure 8:
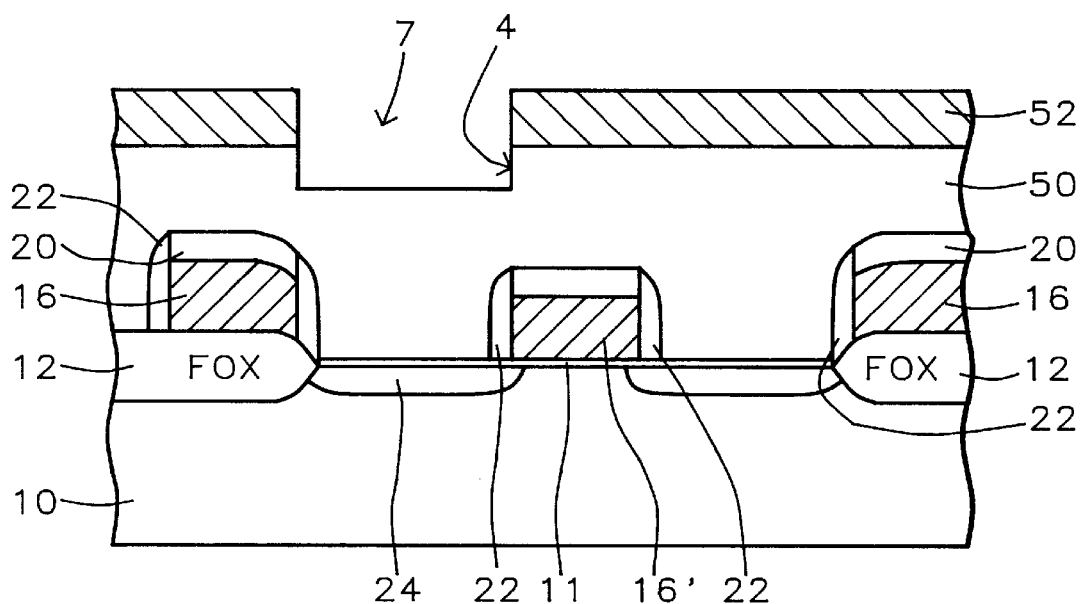

Referring now to FIG. 8, openings 7 are etched in the second conducting layer 52 and partially into the planar insulating layer 50 over the source/drain area 24 using the patterned photoresist layer 50 as the etch mask. The etching is accomplished in a plasma etcher and using anisotropic etch conditions so as to achieve vertical walls 4 within the openings. For example, the polysilicon layer 52 and the planar insulating layer (BPSG) 50 can be etched in a fluorinated gas at low pressure to achieve vertical walls. Some gas mixture that are commonly used for etching are, for example, carbon tetrafluoride ($CF_4$), $CF_4$ and oxygen ($O_2$), $C_2F_6$ and the like. Preferably the mixture is composed of $CF_4$ and $O_2$ and the gas pressure during etching is between about 100 to 400 mTorr. The preferred depth of the recess etched in the planar insulating layer 50 is between about 1000 to 3000 Angstroms and preferably to a depth of about 2000 Angstroms below the surface of layer 50. After etching the opening 7 in layer 52 and partially into the insulating layer 50, the photoresist is striped by conventional means, such as a plasma ashing in an oxygen ($O_2$) ambient.

Figure 9:
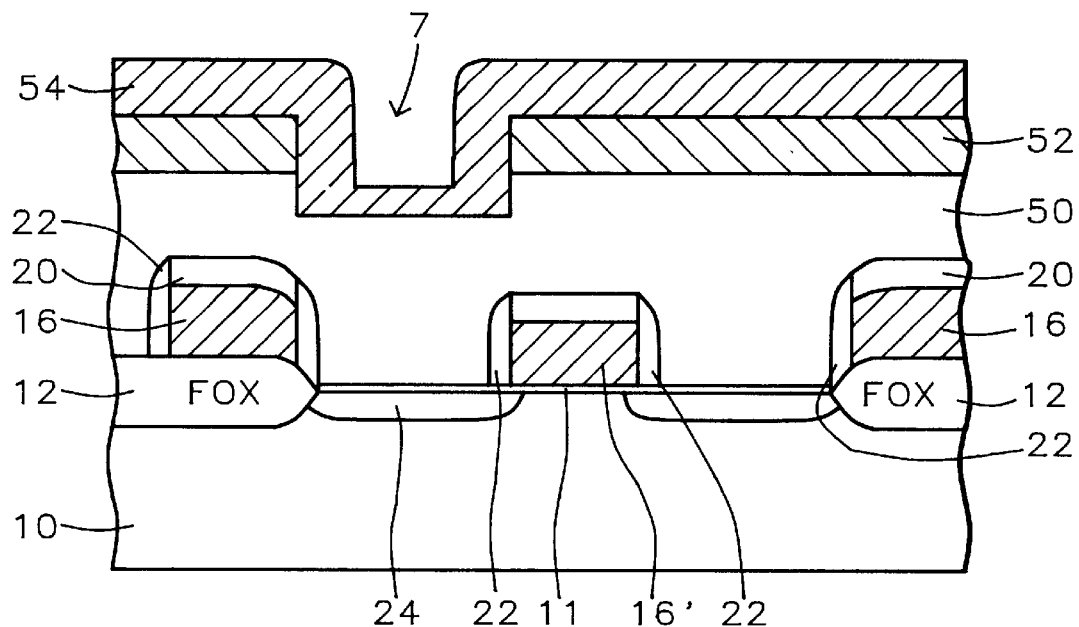

Referring now to FIG. 9, a third conducting layer 54 is conformally deposited on the second conducting layer 52 and in the opening 7. Layer 54 is preferably composed of polysilicon having a N-type dopant, such as arsenic or phosphorus. The preferred method of deposition is a LPCVD and the preferred thickness is a function of the size of the narrow contact opening that is desired, but is typically between about 500 to 2000 Angstroms for an opening 7 in layers 50 and 52 having a width of between about 1500 to 3000 Angstroms. The dopant concentration is preferably between about 1.0 E 20 to 1.0 E 22 atoms/cm$^3$, and the polysilicon layer 54 is either doped by implantation or in situ during the LPCVD.

Layer 54 provides a very important function in the invention because it provides a sidewall spacer in opening 7 that is the means by which very narrow contact openings are achieved that are eventually etched to the source/drain area. This, in essence, extends the resolution capability of the current optical photolithography. As will be seen in the next two process steps, the reduced contact size allows reliable contacts to be made to the source/drain 24 between very closely spaced word lines and gate electrodes, and thereby increasing the packing density of the devices on semiconductor integrated circuits.

Figure 10:
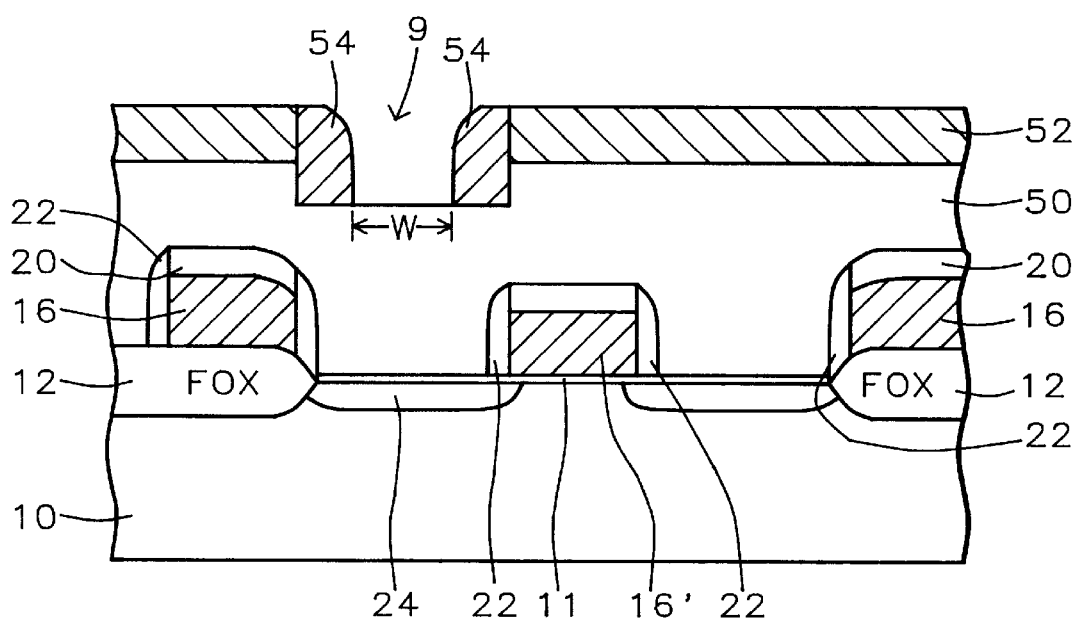

Referring now to FIG. 10, the third conducting layer 54 is blanket etched back anisotropically to the second conducting layer 52, thereby forming sidewall spacers composed of doped polysilicon. The sidewalls spacer in the opening 7, as shown in FIG. 10, are also labeled 54. The layer 54 is also sufficiently etched back to expose the surface of the planar insulating layer 50 within the sidewall spacer region. The preferred etch back is performed in a low pressure reactive ion etcher using, for example, a gas mixture of chlorine ($Cl_2$) and hydrogen bromide (HBr) at a pressure of about 300 mTorr.

The width of the contact opening 7, as shown in FIG. 10, is now reduced by twice the thickness of the sidewall spacers 54. By way of example, if the original opening 7 was 0.4 micrometers wide and the sidewall spacer 54 is 0.1 micrometers, then the new opening 9, as shown in FIG. 10 is only 0.2 micrometer in width W. The original opening 7 and the new reduced opening 9 are also indicated in the elevational view of FIG. 3.

Figure 11:
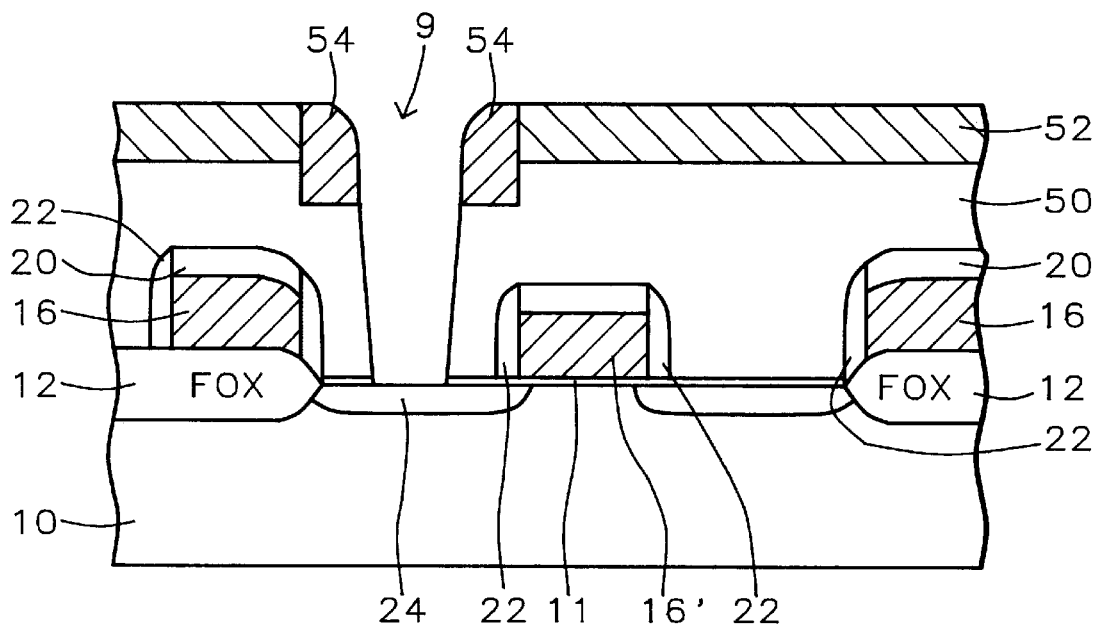

Now continuing with the method of this invention, the second conducting layer 52 and the sidewall spacers 54, both composed of polysilicon are used as an etch mask to etch the very narrow contact opening 7 to the source/drain area 24, of the FET, as shown in FIG. 11. The preferred etch is a anisotropic plasma etch having a high etch rate selectivity of BPSG glass to polysilicon. For example, one preferred plasma etch is in a reactive ion etch chamber using a gas mixture of carbon tetrafluoride ($CF_4$) and oxygen ($O_2$) in a carrier gas, such as argon (Ar). The plasma etch parameters are chosen to achieve an etch selectivity between BPSG and polysilicon that is equal to or greater than about 15 to 1. Also shown in FIG. 11, the high selective etch is used to etch through the thin gate oxide layer 11 over the source/drain area that was previously formed in the device areas for the FET. The selective etch of silicon oxide or BPSG to polysilicon is an ideal etch because it also serves to minimize over etching and therefore damage at the source/drain area which is also composed of silicon.

Figure 12:
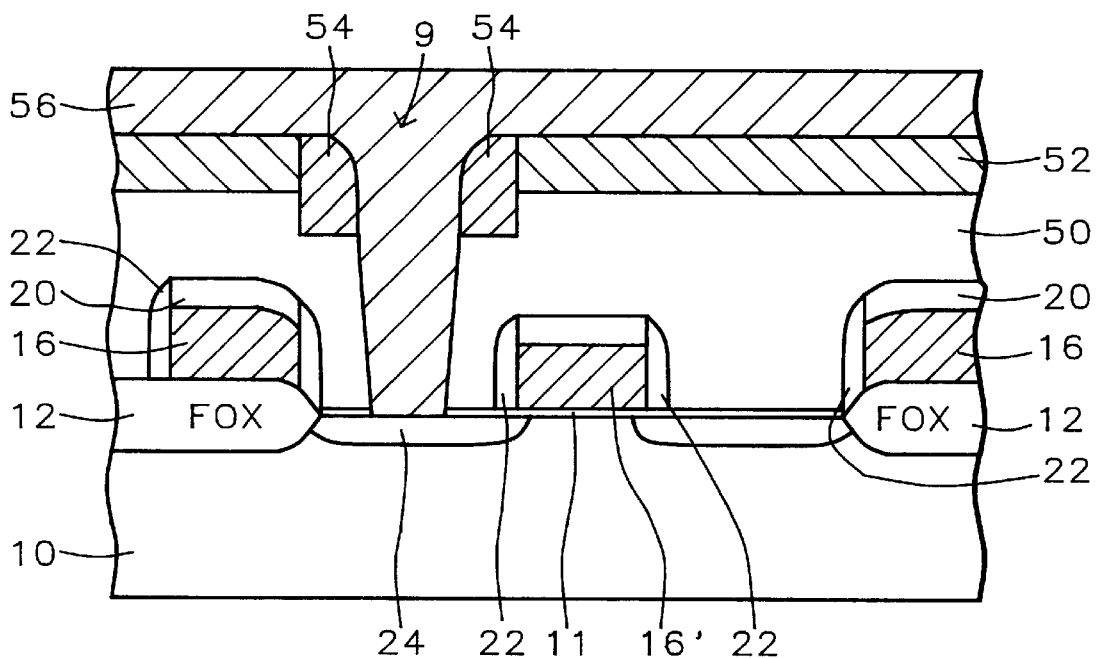

Referring now to FIG. 12, a fourth conducting layer 56, preferably composed of an N doped polysilicon, is deposited over the second conducting layer 52 and in the very narrow contact opening 9. The deposition is of sufficient thickness to fill the opening and to essentially form a planar surface on layer 56. For example, in the previous example where the openings 9 were only 0.2 micrometers in width, a thickness greater than 1000 Angstroms will sufficiently fill the contact opening 9. The preferred thickness of layer 56 is between about 2000 to 3000 Angstroms.

The preferred method of depositing layer 56 is by low pressure chemical vapor deposition (LPCVD), using in situ doping of sufficient concentration to achieve the required low resistance ohmic contact to the source/drain area 24. The preferred dopant for the node contact of this N-channel FET DRAM cell is either arsenic (As) or phosphorus (P), and the preferred dopant concentration is between about 1.0 E 20 to 1.0 E 22 atoms/$cm^3$.

The fourth and second conducting 52 and 56 are then patterned using conventional photolithographic methods and plasma etching to provide the desired next level of patterned conducting layer. For example, is the above if the very narrow contact formed from layer 56 in opening 9 is to be used as a storage capacitor node contact, then the conducting layers 52 and 56 can be patterned to form the bottom electrode of the capacitor, alternatively, more advanced stacked capacitor structures can be built thereon. If the method of this invention is used to make contact to the bit line contacts, then the conducting layers 52 and 56 can be patterned to form the bit line interconnecting metallurgy. The layer 56 can also, if desired, have prior to patterning a metal silicide, such as a tungsten silicide (SiW) formed thereon to further increase the electrical conductivity.

The elevational view in FIG. 3 is shown with a separation between the opening 7 and the adjacent word line 16. This separation ground rule is required in the method for forming a conventional self-aligned contact opening in planar insulating layers so as to avoid electrical shorting problems, as described earlier with reference to FIG. 2. However, in the method of this invention, for forming the narrow contact opening 9 which is smaller than opening 7, as shown in FIG. 3, and the contact can be formed without this separation ground rule. This results in the ability to further reduce the spacing between word lines and increase circuit density.

While the invention has been particularly shown and described with reference to the preferred embodiments thereof, it will be understood by those skilled in the art that various changes in form and details may be made without departing from the spirit and scope of the invention.

What is claimed is:

1. A method for fabricating electrical contacts on semiconductor substrates for integrated circuits, comprising the steps of:

providing a semiconductor substrate having device areas surrounded by field oxide areas;

said substrate having a patterned first conducting layer thereon, and thereby forming portions of semiconductor devices on said device areas and electrical interconnecting lines elsewhere on said field oxide areas;

depositing an insulating layer over and between said patterned first conducting layer, and planarizing said insulating layer over and between said patterned first conducting layer, and thereby forming a planar insulating layer, wherein said insulating layer is borophosphosilicate glass and is between about 2000 and 4500 Angstroms thick;

depositing a second conducting layer over said planar insulating layer, wherein said second conducting layer is polysilicon having a thickness of between about 2000 and 4500 Angstroms;

anisotropically etching openings for contacts in said second conducting layer using a patterned photoresist mask, said openings aligned over said device areas and adjacent to the edges of said first patterned conducting layer, and furthermore partially etching into said planar insulating layer to a depth of 1000 to 3000 Angstroms;

removing said patterned photoresist mask;

depositing conformally a third conducting layer on said second conducting layer and in said openings, wherein said third conducting layer is polysilicon having a thickness of between about 500 and 2000 Angstroms;

blanket etching back anisotropically said third conducting layer to said second conducting layer, and thereby forming sidewall spacers composed of said third conducting layer in said opening, and furthermore said etch back exposing in said openings said insulating layer surface;

anisotropically and selectively etching said insulating layer in said openings to the surface of said semiconductor substrate using said second conducting layer and said sidewall spacers as an etch mask, and thereby forming narrow contact openings in said planar insulating layer, said etching having an etch selectivity of borophosphosilicate glass to silicon that is at least greater than 15:1;

depositing a fourth conducting layer on said second conducting layer and in said narrow contact openings and thereby forming narrow electrical contacts to said semiconductor devices areas;

patterning said fourth and second conducting layer and completing said narrow electrical contacts and further having an electrically conducting interconnecting layer thereon.

2. The method of claim 1, wherein the first conducting layer is composed of polysilicon having a thickness of between about 1000 to 2000 Angstroms.

3. The method of claim 1, wherein said insulating layer is planarized by annealing at a temperature of 800° to 900° C. for about 15 to 30 minutes.

4. The method of claim 1, wherein said fourth conducting layer is polysilicon having a thickness of between about 3000 to 5000 Angstroms.

5. The method of claim 1, wherein said device areas have gate oxide formed thereon, and said patterned portions of said first conducting layer over said device areas form the gate electrodes of field effect transistors.

6. the method of claim 1, wherein said fourth conducting layer in said narrow contact openings provide electrical contacts to the source/drains areas of the field effect transistors for integrated circuits.

7. The method of claim 1, wherein said fourth conducting layer is said narrow contact openings provides electrical contact to the node contacts of the storage cells on a DRAM circuits.

8. The method of claim 1, wherein said fourth conducting layer in said narrow contact openings provides the electrical contact to the bit line contacts of the storage cells on a DRAM circuits.

9. A method for fabricating storage capacitor node contacts for dynamic random access memory (DRAM) cells on semiconductor substrates, comprising the steps of:

providing a semiconductor substrate having an array of device areas having gate oxide formed thereon and surrounded by field oxide areas;

said substrate having a patterned first conducting layer thereon forming an array of field effect transistor (FET) gate electrodes on said array of device areas and forming electrical interconnecting word lines elsewhere on said field oxide areas, said device areas having source/drain areas adjacent to and on each side of said gate electrodes;

depositing an insulating layer over and between said patterned first conducting layer, and planarizing said insulating layer over and between said patterned first conducting layer, and thereby forming a planar insulating layer, wherein said insulating layer is borophosphosilicate glass and is between about 2000 and 4500 Angstroms thick;

depositing a second conducting layer over said planar insulating layer, wherein said second conducting layer is polysilicon having a thickness of between about 2000 and 4500 Angstroms;

anisotropically etching openings for contacts in said second conducting layer using a patterned photoresist mask, said openings aligned over one of the two source/drain area of each FET, and furthermore partially etching into said planar insulating layer to a depth of 1000 to 3000 Angstroms;

removing said patterned photoresist mask;

depositing conformally a third conducting layer on said second conducting layer and in said openings, wherein said third conducting layer is polysilicon having a thickness of between about 500 and 2000 Angstroms;

blanket etching back anisotropically said third conducting layer to said second conducting layer, and thereby forming sidewall spacers composed of said third conducting layer in said opening, and furthermore said etch back exposing in said openings the surface of said insulating layer;

anisotropically and selectively etching said insulating layer in said openings to said source/drain areas using said second conducting layer and said sidewall spacers as an etch mask and, thereby forming said small storage capacitor node contact openings having reduced width, said etching having an etch selectivity of borophosphosilicate glass to silicon that is at least greater than 15:1;

depositing a fourth conducting layer on said second conducting layer and in said storage node contact openings and electrically contacting said source/drain areas;

patterning said fourth and second conducting layer and completing said small storage node contacts on said DRAM chip.

10. The method of claim 9, wherein the first conducting layer is composed of polysilicon having a thickness of between about 1000 to 2000 Angstroms.

11. The method of claim 9, wherein said insulating layer is planarized by annealing at a temperature of 800° to 900° C. for about 15 to 30 minutes.

12. The method of claim 9, wherein said fourth conducting layer is polysilicon having a thickness of between about 3000 to 5000 Angstroms.

* * * * *